United States Patent

Nakano

[11] Patent Number: 5,952,901
[45] Date of Patent: Sep. 14, 1999

[54] LAMINATED ELECTRONIC COMPONENT WITH TRIMMABLE PARALLEL ELECTRODES

[75] Inventor: Kazuhiro Nakano, Fukushima-ken, Japan

[73] Assignee: Alps Electric Co., Ltd., Tokyo, Japan

[21] Appl. No.: 08/974,003

[22] Filed: Nov. 19, 1997

[30] Foreign Application Priority Data

Nov. 20, 1996 [JP] Japan .................................... 8-309123

[51] Int. Cl.⁶ ........................................................ H01P 7/08
[52] U.S. Cl. ........................................ 333/235; 331/107 SL
[58] Field of Search .................................. 333/204, 205, 333/219, 235, 246; 331/96, 107 SL

[56] References Cited

U.S. PATENT DOCUMENTS

| | | | |
|---|---|---|---|
| 4,288,530 | 9/1981 | Bedard et al. ................. | 333/205 X |
| 5,805,026 | 9/1998 | Kuroda et al. ................. | 333/205 X |

FOREIGN PATENT DOCUMENTS

| | | | |
|---|---|---|---|
| 1-316002 | 12/1989 | Japan ................................... | 333/204 |
| 2-256210 | 10/1990 | Japan . | |
| 4-329705 | 11/1992 | Japan . | |
| 5-110319 | 4/1993 | Japan ................................... | 333/219 |
| 5-267904 | 10/1993 | Japan ................................... | 333/205 |
| 5-275910 | 10/1993 | Japan ................................... | 333/219 |
| 08088527 | 4/1996 | Japan . | |

*Primary Examiner*—Seungsook Ham
*Attorney, Agent, or Firm*—Brinks Hofer Gilson & Lione

[57] ABSTRACT

A laminated electronic component has a structure in which an micro-strip line (MSL) is formed in a first dielectric layer, and a first ground layer and an adjustment pattern layer are formed on the top surface and the base surface of the first dielectric layer, respectively. A second dielectric layer is formed between the adjustment pattern layer and a second ground layer, comb teeth-shaped parallel electrodes having an area larger than that of the MSL is formed at a position opposed to the MSL in the adjustment pattern layer. A slit is formed not to be opposed to the MSL in the second ground layer and to be opposed to the connection points of the parallel electrodes. By emitting a laser beam from the direction of the second ground layer through the slit and the second dielectric layer, and separating the connection points of the parallel electrodes, the capacitance between the MSL and the ground can be adjusted in steps, which increases the resonant frequency of the MSL.

1 Claim, 3 Drawing Sheets

LAMINATED ELECTRONIC COMPONENT WITH TRIMMABLE PARALLEL ELECTRODES

BACKGROUND OF THE INVENTION

1. Field of the Invention

The present invention relates to laminated electronic components in which a resonant line is disposed in a multilayer-circuit substrate to form, e.g., a voltage control oscillator (hereinafter referred to as a "VCO"), and in particular, to a laminated electronic component having a resonant frequency capable of being adjusted by trimming.

2. Description of the Related Art

A multilayer-circuit substrate known as a VCO module, is formed such that an interconnection conductive layer to be provided with electronic components is formed on the top surface, a resonant conductive layer provided with a micro-strip line (hereinafter referred to as an "MSL") as a resonant line is formed in the inside, and a grounded conductive layer for the MSL is formed under the resonant conductive layer or on the base surface. Adjusting the oscillating frequency of the above structured VCO module to a predetermined frequency requires the trimming of the MSL in a production process.

As for a method for adjusting the oscillating frequency, as disclosed in Japanese Patent Unexamined Publication No. 4-329705, there is a conventionally proposed method in which part of an MSL formed in a multilayer-circuit substrate is extracted as an adjustment electrode to the top surface of the multilayer-circuit substrate, and this adjustment electrode is trimmed by appropriate means such as cutting. In addition, as another conventional example, a method for trimming with a laser beam each part of a grounded conductive layer and a dielectric layer and an inside MSL from the base surface of a multilayer-circuit substrate has been proposed.

In the former structure among the above-described conventional examples the part of the MSL needs to be extracted as the adjustment electrode to the top surface of the multilayer-circuit substrate, and the top surface is a mounting surface on which an electronic component is mounted. Thus, the mounting surface must be inevitably expanded, which disadvantageously hinders a reduction in the size of the circuit substrate.

In addition, in the latter structure, a metallic layer to be shrunken when it is trimmed consists of two layers: the MSL and the grounded conductive layer, and the thickness of the dielectric layer from the base surface to the MSL cannot be reduced due to its characteristics. Thus, problems occur in which a laser apparatus with large output is required, which increases costs, and exposure of the MSL after the trimming is performed causes the MSL to oxidize, crack and so forth.

SUMMARY OF THE INVENTION

Accordingly, it is an object of the present invention is to provide a laminated electronic component suitable for size reduction, in which trimming can be performed without a large-output laser apparatus, and the oxidation and cracking of a micro-strip line can be prevented.

To this end, according to the present invention, the foregoing object has been achieved through provision of a laminated electronic component including: a first dielectric layer in which a micro-strip line is formed; a conductive resonant-frequency adjustment layer which opposes the micro-strip line, with the first dielectric layer provided between them; and a ground layer which opposes the conductive resonant-frequency adjustment layer, with a second dielectric layer provided between them, and to which ground layer the conductive resonant-frequency adjustment layer is electrically connected.

Preferably, the conductive resonant-frequency adjustment layer includes: a plurality of parallel electrodes opposed to the micro-strip line, with the first dielectric layer provided between them; and connection portions for connecting ends of the parallel electrodes, and the connection portions are formed not to be opposed to the micro-strip line.

In the ground layer a slit opposed to points at which the parallel electrodes and the connection portions are connected may be formed.

According to the present invention, by using a structure in which an intermediate ground layer electrically connected to a ground layer is provided between an MSL and the ground layer opposed to the MSL and part of the intermediate ground layer can be easily cut, the need for using a laser apparatus with large output is eliminated, and the oxidation of the MSL and cracks can be prevented, which enables a reduction in the size of a circuit substrate.

When a plurality of parallel electrodes connected by connection portions are formed in a resonant frequency-adjustment layer, by using a laser beam to successively cut the connection points of the parallel electrodes via the ground layer and a second dielectric layer, the capacitance between the MSL and the ground can be reduced in steps, which enables the fine adjustment of the MSL resonant frequency.

In addition, by forming a slit opposed to the parallel electrodes and the connection portions in the ground layer, the positions of the connection points of the parallel electrodes can be clarified by the slit, and a portion of the ground layer to be cut can be removed to eliminate the need for shrinking with the laser beam, which enables a reduction in the output of the laser beam.

DESCRIPTION OF THE PREFERRED EMBODIMENTS

Referring to the attached Drawings, embodiments of the present invention will be described below.

Figure 1:
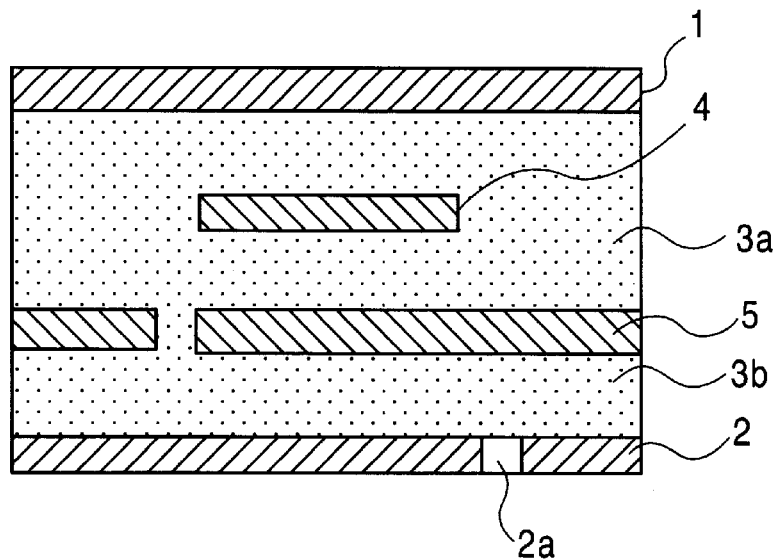
FIG. 1 is a cross-sectional view showing a laminated electronic component according to an embodiment of the present invention.
Figure 2:
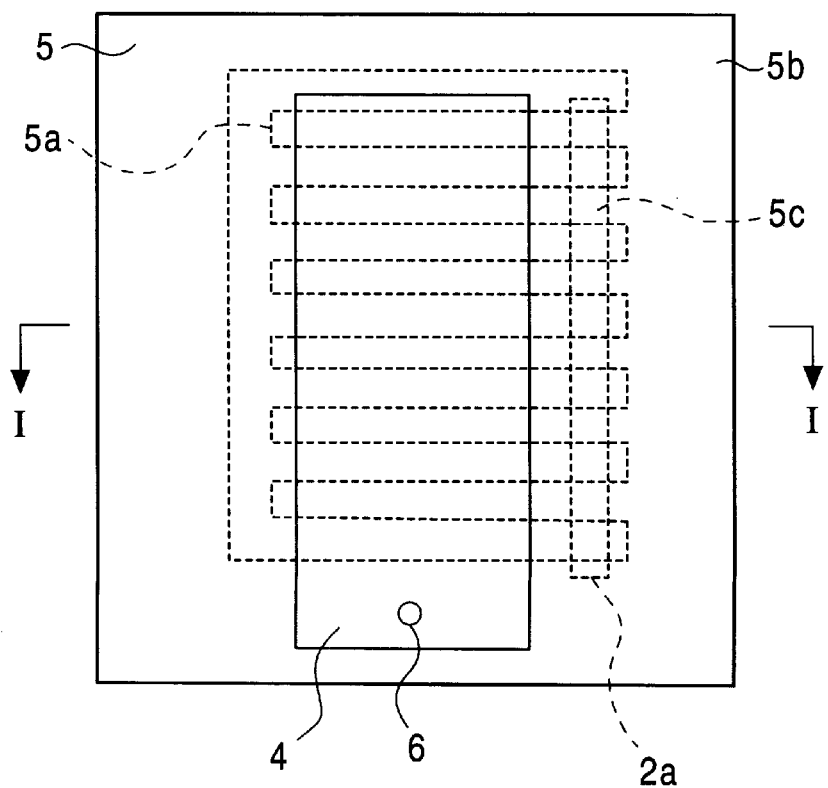
FIG. 2 is a plan view showing the laminated electronic component shown in FIG. 1.
Figure 3:
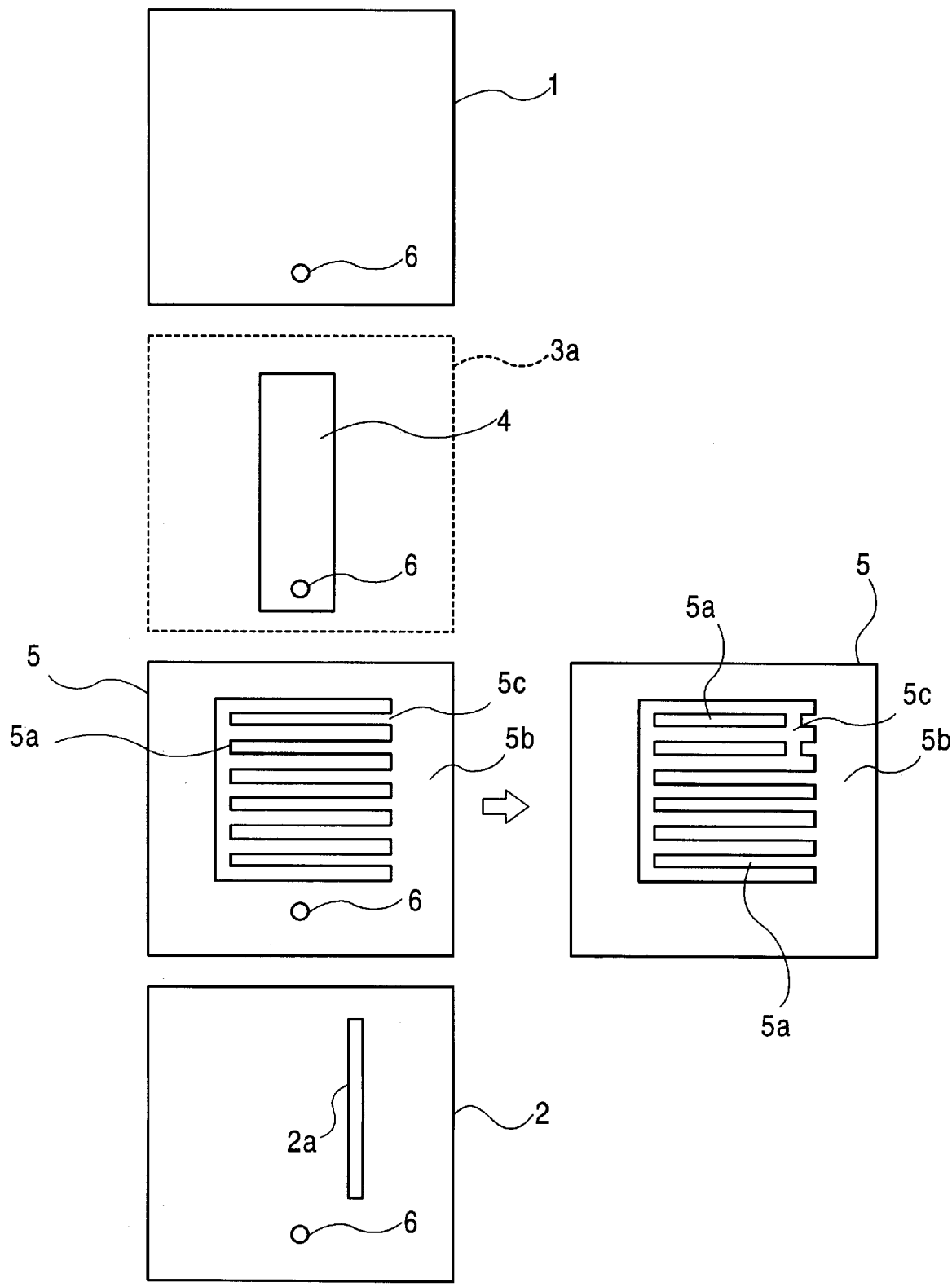
FIG. 3 is a plan view showing the layers of the laminated electronic component shown in FIG. 1.
Figure 4:
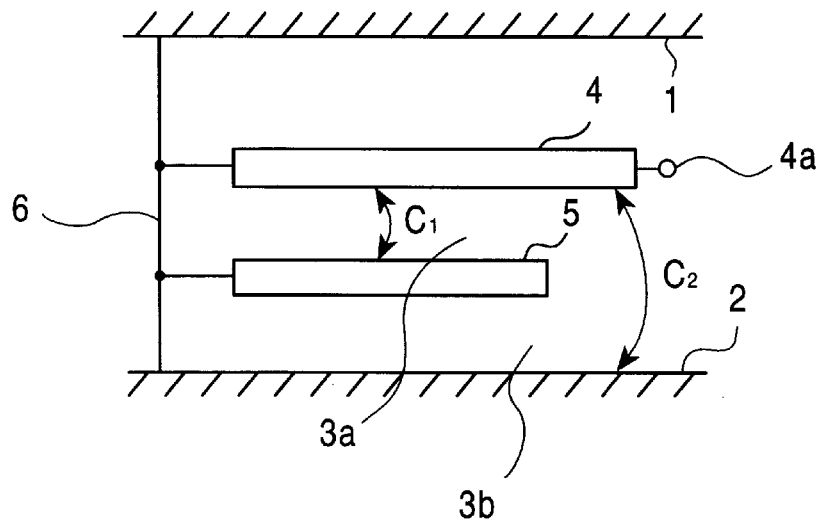
FIG. 4 is a schematic chart showing a circuit of the laminated electronic component shown in FIG. 1.

FIG. 1 shows a cross-sectional view of a laminated electronic component taken on line I—I in FIG. 2. FIG. 2 is a plan view of the laminated electronic component shown in FIG. 1. FIG. 3 shows a plan view of the layers of the laminated electronic component shown in FIG. 1. FIG. 4 shows an explanatory chart of a circuit of the laminated electronic component shown in FIG. 1.

As shown in FIGS. 1 to 3, in a first dielectric layer 3a is formed a micro-strip line (MSL) 4, and on the top surface and the base surface of the first dielectric layer 3a are formed a first ground layer 1 and an adjustment pattern layer 5, respectively. In addition, a second dielectric layer 3b is formed between the adjustment pattern layer 5 and the second ground layer 2. The first ground layer 1 forms an interconnection conductive layer on a circuit substrate (not shown). Electronic components are mounted on the first ground layer 1.

The MSL 4 is formed to be rectangular when is observed from above, and in plan view has a smaller area compared with the other layers 1, 2, 3a, 3b and 5. On the adjustment pattern layer 5 there are formed a plurality of parallel electrodes 5a, and a connection portion 5b on which the parallel electrodes 5a are connected at connection points 5c. The parallel electrodes 5a as a whole are formed in the shape of comb teeth. The parallel electrodes 5a are formed to be opposed to the MSL 4 as shown in FIG. 1, and the connection points 5c and the connection portion 5b are formed not to be opposed to the MSL 4. In the second ground layer 2 is formed a longitudinal slit 2a. The slit 2a is formed to be opposed to the connection points 5c. As shown in FIGS. 2 and 3, a throughhole 6 is formed at ends of the first and second ground layers 1 and 2, the first and second dielectric layers 3a and 3b and the adjustment pattern layer 5. The layers are electrically connected via the throughhole 6.

When the above-described structure is applied to the resonant circuit of an oscillator, there is formed a circuit arrangement as shown in FIG. 4 in which one end of the MSL 4 is connected to an extraction electrode 4a, and another end is connected to the first and second ground layers 1 and 2 via the throughhole 6. One end of the adjustment layer 5 is open, and another end is connected to the first and second ground layers 1 and 2.

Capacitance C1 formed by the first dielectric layer 3a exists between the MSL 4 and the adjustment layer 5. Accordingly, in the structure shown in FIGS. 1 to 3, when a laser beam is emitted from the direction of the second ground layer 2 via the slit 2a and the second dielectric layer 3b, and the parallel electrodes 5a are separated at the connection points 5c from the connection portion 5b, the separated parallel electrodes 5a become in an electrically unstable condition from the grounded condition, and on the portion of the separated parallel electrodes 5a the MSL 4 instead of the parallel electrodes 5a is opposed to the second ground layer 2, which changes the capacitance between the MSL 4 and the ground from C1 to C2. Since the capacitance C2 exists by joining the first dielectric layer 3a forming the capacitance C1 and the second dielectric layer 3b, it is less than the capacitance C1. Therefore, separating the parallel electrodes 5a reduces the capacitance between the MSL 4 and the ground, and changes the characteristic impedance of the MSL, which increases the resonant frequency. Accordingly, by separating an arbitrary number of the parallel electrodes 5a, the resonant frequency of the MSL can be adjusted in steps. Since separating the parallel electrodes 5a increases the resonant frequency, the resonant frequency of the MSL needs to be set lower than a predetermined value.

According to the above structure, the MSL is not shrunken, so that the MSL cannot be oxidized, and no cracks occur in the MSL, which maintains the characteristics of the MSL for a long period. In addition, the second dielectric layer 3b can be made sufficiently thinner without considering the characteristics of the MSL 4. Thus, the output of the laser beam for trimming can be reduced. By previously forming the slit 2a in the second ground layer 2, a position at which the adjustment pattern layer 5 should be cut can be clarified by the slit 2a, and the need for shrinking the second ground layer 2 is eliminated. Thus, the output of the laser beam can be further reduced.

Figure 5:
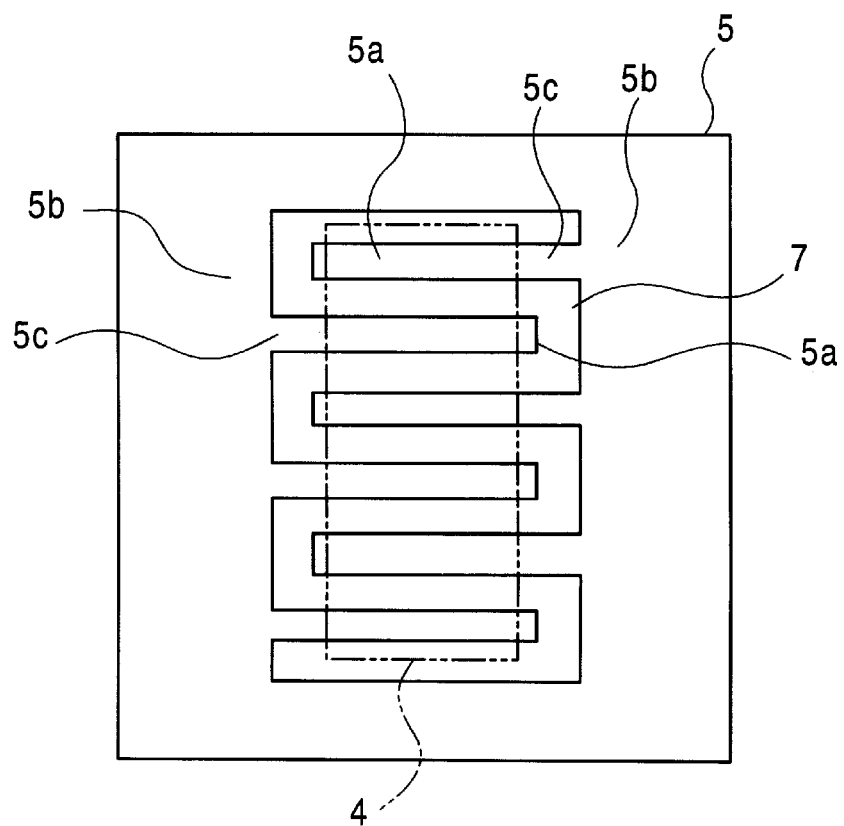
FIG. 5 is a plan view showing a laminated electronic component including a modification of an adjustment pattern layer, according to another embodiment of the present invention.

In the above embodiment the case where the comb teeth-shaped parallel electrodes 5a are formed on the adjustment pattern layer 5 has been described. However, the parallel electrodes 5a are not limited to the shape of comb teeth. For example, as shown in FIG. 5, it is possible that one end of each parallel electrode 5a is connected to each other via a connection portion 5b, and an opening 7 in the shape of cranks is formed around the parallel electrode 5a. In this case, left and right connection portions 5b are formed not to be opposed to the MSL 4, and connection points 5c may be trimmed.

What is claimed is:

1. A laminated electronic component with trimmable parallel electrodes comprising:

a first dielectric layer inside of which a micro-strip line is formed;

a conductive resonant-frequency adjustment layer which opposes said micro-strip line, wherein said first dielectric layer is disposed between said micro-strip line and said conductive resonant-frequency adjustment layer;

said conductive resonant-frequency adjustment layer including a plurality of parallel electrodes opposed to said micro-strip line, wherein said first dielectric layer is disposed between said plurality of parallel electrodes and said micro-strip line, and said conductive resonant-frequency adjustment layer including connection portions for connecting ends of said parallel electrodes, wherein said connection portions are formed so as not to be opposed to said micro-strip line; and a ground layer, which opposes said conductive resonant-frequency adjustment layer and to which said conductive resonant-frequency adjustment layer is electrically connected, wherein a second dielectric layer is disposed between said ground layer and said conductive resonant-frequency adjustment layer;

wherein a slit is formed in said ground layer, said slit opposed to points at which said parallel electrodes and said connection portions are connected, said slit being formed by removing said conductive film of said ground layer so as to facilitate trimming of said parallel electrodes by a laser beam.

* * * * *